(12) United States Patent
Ishida et al.

(10) Patent No.: US 10,416,485 B2
(45) Date of Patent: Sep. 17, 2019

(54) DISPLAY DEVICE

(71) Applicant: Japan Display Inc., Minato-ku (JP)

(72) Inventors: Arichika Ishida, Tokyo (JP); Yasushi Kawata, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 26 days.

(21) Appl. No.: 15/826,946

(22) Filed: Nov. 30, 2017

(65) Prior Publication Data

US 2018/0081211 A1    Mar. 22, 2018

Related U.S. Application Data

(62) Division of application No. 14/164,912, filed on Jan. 27, 2014, now abandoned.

(30) Foreign Application Priority Data

Feb. 20, 2013  (JP) ................................ 2013-030997

(51) Int. Cl.
*G02F 1/1333* (2006.01)
*H01L 51/00* (2006.01)

(52) U.S. Cl.
CPC ...... *G02F 1/1333* (2013.01); *G02F 1/133305* (2013.01); *H01L 51/0097* (2013.01); *G02F 1/133351* (2013.01); *G02F 2001/133302* (2013.01); *G02F 2001/133354* (2013.01);
(Continued)

(58) Field of Classification Search
CPC ............. G02F 1/1333; G02F 1/133305; G02F 2001/133302; G02F 2001/133354; G02F 1/133351; G02F 2201/54; H01L 51/0097
See application file for complete search history.

(56) References Cited

U.S. PATENT DOCUMENTS

| 2003/0168723 | A1 | 9/2003 | Shibata |
| 2005/0127371 | A1 | 6/2005 | Yamazaki |
| 2009/0047859 | A1 | 2/2009 | Kim et al. |

(Continued)

FOREIGN PATENT DOCUMENTS

| CN | 101075633 A | 11/2007 |
| JP | 2-141997 U | 11/1990 |

(Continued)

OTHER PUBLICATIONS

Office Action dated Oct. 28, 2015 in Korean Patent Application No. 10-2014-0017724 (w/English language translation).

(Continued)

*Primary Examiner* — Jessica M Merlin
(74) *Attorney, Agent, or Firm* — Oblon, McClelland, Maier & Neustadt, L.L.P.

(57) ABSTRACT

According to one embodiment, a display device includes a first substrate including a first resin substrate having a first thermal expansion coefficient, and a first barrier layer having a second thermal expansion coefficient which is lower than the first thermal expansion coefficient, a second substrate including a second resin substrate having a third thermal expansion coefficient which is equal to the first thermal expansion coefficient, and a second barrier layer having a fourth thermal expansion coefficient which is lower than the third thermal expansion coefficient and is equal to the first thermal expansion coefficient, and a display element located between the first resin substrate and the second resin substrate.

9 Claims, 6 Drawing Sheets

(52) U.S. Cl.
    CPC .. *G02F 2201/54* (2013.01); *H01L 2924/0002* (2013.01); *Y02E 10/549* (2013.01); *Y02P 70/521* (2015.11)

(56) References Cited

U.S. PATENT DOCUMENTS

| | | |
|---|---|---|
| 2010/0073615 A1 | 3/2010 | Yaguchi et al. |
| 2012/0001534 A1 | 1/2012 | Kim |
| 2012/0034451 A1 | 2/2012 | Seo et al. |

FOREIGN PATENT DOCUMENTS

| | | |
|---|---|---|
| JP | 2002-270634 | 9/2002 |
| JP | 2003-86356 A | 3/2003 |
| JP | 2003-86356 A5 | 3/2003 |
| JP | 2009-109873 | 5/2009 |
| JP | 2009-117178 A | 5/2009 |
| JP | 2009-199979 | 9/2009 |
| JP | 2010-72529 | 4/2010 |
| JP | 2010-244698 | 10/2010 |
| JP | 2011-53672 | 3/2011 |
| JP | 2011-82070 | 4/2011 |
| JP | 2011-165654 A | 8/2011 |
| KR | 10-2002-0097028 A | 12/2002 |
| WO | WO 2012/176417 A1 | 12/2012 |

OTHER PUBLICATIONS

Combined Chinese Office Action and Search Report dated Mar. 4, 2016 in Patent Application No. 201410056603.3 (w/English translation).
Office Action dated May 24, 2016 in Japanese Patent Application No. 2013-030997 (w/English language translation).
Korean Office Action dated Mar. 30, 2017 in Patent Application No. 10-2016-0099407 (w/English translation).
Office Action dated May 22, 2018 in Japanese Patent Application No. 2017-118612 (with English language translation) 8 pages.

DISPLAY DEVICE

CROSS-REFERENCE TO RELATED APPLICATIONS

This application is a division of and claims the benefit of priority under 35 U.S.C. § 120 from U.S. application Ser. No. 14/164,912 filed Jan. 27, 2014, and claims the benefit of priority under 35 U.S.C. § 119 from Japanese Patent Application No. 2013-030997 filed Feb. 20, 2013, the entire contents of each of which are incorporated herein by reference.

FIELD

Embodiments described herein relate generally to a display device.

BACKGROUND

Display devices including organic electroluminescence (EL) elements or liquid crystal elements have been used in various fields. A display device is constructed by stacking a plurality of members. In such a display device, there is a concern that a warp occurs due to a difference in thermal expansion coefficient between the respective members.

For example, as regards an optical sheet in which a plurality of optical elements, which are formed of materials with different thermal expansion coefficients, are adhered or attached, there is known a technique of reducing a warp by providing a warp prevention layer having a thermal expansion coefficient which is equal to a thermal expansion coefficient of an optical functional member. In addition, as regards an organic EL device configured such that a warp-reducing substrate, which is opposed to a light emission element provided on a substrate body formed of glass, and a warp-reducing substrate disposed on that surface of the substrate body, which is not opposed to the light emission element, are attached, there is also known a technique in which the two warp-reducing substrates are formed of materials having an equal thermal expansion coefficient, and the thermal expansion coefficient of the materials is close to the thermal expansion coefficient of the substrate body, thereby reducing a warp. Furthermore, as regards a semiconductor device in which a semiconductor chip is bonded on a substrate, there is known a technique in which a warp prevention sheet, which is bonded to the other surface of the semiconductor chip, and the substrate have substantially equal thermal expansion coefficients, thereby preventing a warp of the semiconductor device.

DETAILED DESCRIPTION

In general, according to one embodiment, a display device includes: a first substrate including a first resin substrate having a first thermal expansion coefficient, a first barrier layer which covers an inner surface of the first resin substrate and has a second thermal expansion coefficient which is lower than the first thermal expansion coefficient, and a switching element formed above the first barrier layer; a second substrate including a second resin substrate which is formed of a material different from a material of the first resin substrate and has a third thermal expansion coefficient which is equal to the first thermal expansion coefficient, a second barrier layer which covers an inner surface of the second resin substrate and has a fourth thermal expansion coefficient which is lower than the third thermal expansion coefficient and is equal to the first thermal expansion coefficient; and a display element located between the first resin substrate and the second resin substrate and including a pixel electrode which is electrically connected to the switching element.

Figure 1A:
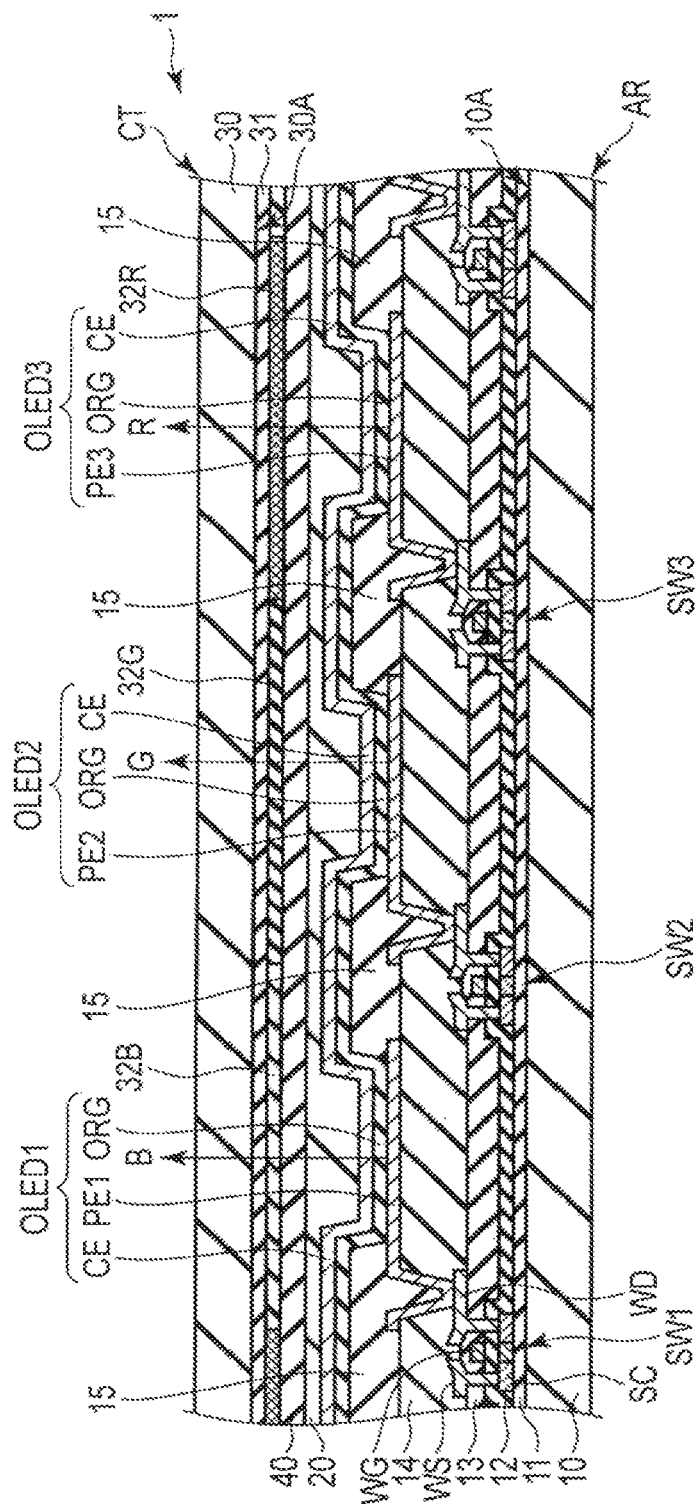
FIG. 1A is a cross-sectional view which schematically illustrates a structure example of a display device 1 of an embodiment.

FIG. 1A is a cross-sectional view which schematically illustrates a structure example of a display device 1 of the embodiment. A description is given of a cross-sectional structure of an organic EL display device as an example of the display device 1.

The illustrated organic EL display device 1 adopts an active matrix driving method, and includes an array substrate AR and a counter-substrate CT. The array substrate AR is formed by using a first resin substrate 10. The array substrate AR includes, on an inner surface 10A side of the first resin substrate 10, a first insulation film 11, a second insulation film 12, a third insulation film 13, a fourth insulation film 14, ribs 15, switching elements SW1 to SW3, and organic EL elements OLED1 to OLED3 functioning as display elements.

The first resin substrate 10 is an insulative substrate, which is formed of, for example, a material consisting mainly of polyimide (PI). The first resin substrate 10 has a thickness of, e.g. 5 to 30 µm. As the material for forming the first resin substrate 10, a material with a high heat resistance, such as polyamide-imide or polyaramide, as well as polyimide, is selected. Specifically, the first resin substrate 10 is often exposed to a high-temperature process in the formation of various insulation films, the formation of switching elements, and the formation of organic EL elements. Thus, the most important property, which is required for the first resin substrate 10, is a high heat resistance. As will be described later, the organic EL element is of a so-called top emission type which emits light via the counter-substrate CT. Accordingly, it is not always necessary that the first resin substrate 10 have high transparency, and the first resin substrate 10 may be colored.

The inner surface 10A of the first resin substrate 10 is covered with the first insulation film 11. The first insulation film 11 functions as a first barrier layer for suppressing entrance of ionic impurities from the first resin substrate 10 or entrance of moisture via the first resin substrate 10. The first insulation film 11 is formed of an inorganic material including silicon as a main component, such as silicon nitride (SiN), silicon oxide (SiO) or silicon oxynitride (SiON), and is composed of a single layer or a multilayer. For example, the first insulation film 11 is formed of a multilayer body in which silicon nitride and silicon oxide are alternately stacked. Incidentally, the first insulation film 11 may be formed of some other material which can ensure a barrier capability.

The switching elements SW1 to SW3 are formed on the first insulation film 11. The switching elements SW1 to SW3 are, for example, thin-film transistors (TFTs) each including a semiconductor layer SC. The switching elements SW1 to SW3 have the same structure. In the description below, attention is paid to the switching element SW1, and the structure thereof is described more specifically.

In the example illustrated, the switching element SW1 is of a top gate type, but may be of a bottom gate type. The semiconductor layer SC is formed of a silicon-based material such as amorphous silicon or polysilicon, or an oxide semiconductor which is an oxide including at least one of indium (In), gallium (Ga) and zinc (Zn).

The semiconductor layer SC is formed on the first insulation film 11, and is covered with a second insulation film 12. The second insulation film 12 is also disposed on the first insulation film 11. A gate electrode WG of the switching element SW1 is formed on the second insulation film 12. The gate electrode WG is covered with a third insulation film 13. The third insulation film 13 is also disposed on the second insulation film 12.

A source electrode WS and a drain electrode WD of the switching element SW1 are formed on the third insulation film 13. The source electrode WS is put in contact with a source region of the semiconductor layer SC. The drain electrode WD is put in contact with a drain region of the semiconductor layer SC. The source electrode WS and drain electrode WD are covered with a fourth insulation film 14. The fourth insulation film 14 is also disposed on the third insulation film 13.

The organic EL elements OLED1 to OLED3 are formed on the fourth insulation film 14. In the example illustrated, the organic EL element OLED1 is electrically connected to the switching element SW1, the organic EL element OLED2 is electrically connected to the switching element SW2, and the organic EL element OLED3 is electrically connected to the switching element SW3. The color of emission light of each of the organic EL elements OLED1 to OLED3 is white. The organic EL elements OLED1 to OLED3 have the same structure.

The organic EL element OLED1 includes a pixel electrode PE1 which is formed on the fourth insulation film 14. The pixel electrode PE1 is in contact with the drain electrode WD of the switching element SW1 and is electrically connected to the switching element SW1. Similarly, the organic EL element OLED2 includes a pixel electrode PE2 which is electrically connected to the switching element SW2, and the organic EL element OLED3 includes a pixel electrode PE3 which is electrically connected to the switching element SW3. The pixel electrodes PE1 to PE3 function as, for example, anodes. The pixel electrodes PE1 to PE3 may be formed of a transparent, electrically conducive material such as indium tin oxide (ITO) or indium zinc oxide (IZO), or may be formed of a metallic material such as aluminum (Al), magnesium (Mg), silver (Ag), titanium (Ti), or an alloy thereof. In the case of the top emission type, it is desirable that the pixel electrodes PE1 to PE3 include reflective layers formed of a metallic material with a high reflectivity.

The organic EL elements OLED1 to OLED3 further include an organic light emission layer ORG and a common electrode CE. The organic light emission layer ORG is located on the pixel electrodes PE1 to PE3. In addition, the organic light emission layer ORG is continuously formed, without a break, over the organic EL elements OLED1 to OLED3. The common electrode CE is located on the organic light emission layer ORG. In addition, the common electrode CE is continuously formed, without a break, over the organic EL elements OLED1 to OLED3. The common electrode CE is formed of, for example, a transparent, electrically conductive material such as ITO or IZO.

Specifically, the organic EL element OLED1 is composed of the pixel electrode PE1, organic light emission layer ORG and common electrode CE. The organic EL element OLED2 is composed of the pixel electrode PE2, organic light emission layer ORG and common electrode CE. The organic EL element OLED3 is composed of the pixel electrode PE3, organic light emission layer ORG and common electrode CE.

In the meantime, in the organic EL elements OLED1 to OLED3, a hole injection layer or a hole transport layer may be further provided between each of the pixel electrodes PE1 to PE3 and the organic light emission layer ORG, and an electron injection layer or an electron transport layer may be further provided between the organic light emission layer ORG and the common electrode CE.

The organic EL elements OLED1 to OLED3 are partitioned by the ribs 15. The ribs 15 are formed on the fourth insulation film 14 and cover the edges of the pixel electrodes PE1 to PE3. The ribs 15 are formed, for example, in a grid shape or in a stripe shape on the fourth insulation film 14. The ribs 15 are covered with the organic light emission layer ORG. Specifically, the organic light emission layer ORG extends over not only the pixel electrodes PE1 to PE3 but also over the ribs 15.

In the example illustrated, the organic EL elements OLED1 to OLED3 are sealed by a sealing film 20. The sealing film 20 functions as a barrier film which protects the organic EL elements OLED1 to OLED3 from contaminants such as moisture, oxygen and hydrogen. The sealing film 20 is formed of an inorganic material including silicon as a main component, such as silicon nitride (SiN), silicon oxide (SiO) or silicon oxynitride (SiON), and is composed of a single layer or a multilayer.

The counter-substrate CT is formed by using a transparent second resin substrate 30. The counter-substrate CT includes a fifth insulation film 31, a blue color filter 32B, a green color filter 32G and a red color filter 32R on an inner surface 30A side of the second resin substrate 30.

The second resin substrate 30 is a transparent resin substrate, which is formed of, for example, a material consisting mainly of polyimide (PI). The second resin substrate 30 has a thickness which is equal to the thickness of the first resin substrate 10, for example, a thickness of 5 to 30 μm. As the material for forming the second resin substrate 30, a material with high transparency is selected. Specifically, light emitted from the organic EL elements OLED1 to OLED3 of the top emission type passes through the second resin substrate 30. Thus, the most important property, which is required for the second resin substrate 30, is a high transparency. In this manner, the property that is required is different between the first resin substrate 10 and the second resin substrate 30. Thus, the second resin substrate 30 is formed of a material which is different from the material of the first resin substrate 10. For example, the first resin substrate 10 is formed by using an opaque polyimide with good heat resistance, and the second resin substrate 30 is formed by using a transparent polyimide.

The inner surface 30A of the second resin substrate 30 is covered with a fifth insulation film 31. The fifth insulation film 31 functions as a second barrier layer for suppressing entrance of ionic impurities from the second resin substrate 30 or entrance of moisture via the second resin substrate 30. The fifth insulation film 31 is formed of an inorganic material including silicon as a main component, such as silicon nitride (SiN), silicon oxide (SiO) or silicon oxynitride (SiON), and is composed of a single layer or a multilayer. For example, the fifth insulation film 31 has the same structure as the first insulation film 11, and is formed of a multilayer body in which silicon nitride and silicon oxide are alternately stacked.

The thermal expansion coefficient of the second resin substrate 30 is substantially equal to the thermal expansion coefficient of the first resin substrate 10. In addition, the thermal expansion coefficient of the fifth insulation film 31 is substantially equal to the thermal expansion coefficient of the first insulation film 11. Besides, the thermal expansion coefficients of the fifth insulation film 31 and first insulation film 11 are lower than the thermal expansion coefficients of the first resin substrate 10 and second resin substrate 30. For example, each of the thermal expansion coefficients of the fifth insulation film 31 and first insulation film 11 is 0.5 to 3 ppm/° C., and each of the thermal expansion coefficients of the first resin substrate 10 and second resin substrate 30 is 20 to 50 ppm/° C. The thermal expansion coefficients of the first resin substrate 10, second resin substrate 30, fifth insulation film 31 and first insulation film 11 are so set as to meet the above-described relationship, and thereby a warp of the display device 1 can be prevented.

The blue color filter 32B is opposed to the organic EL element OLED1 and passes a light component of a blue wavelength of white light. The green color filter 32G is opposed to the organic EL element OLED2 and passes a light component of a green wavelength of white light. The red color filter 32R is a red color filter which is opposed to the organic EL element OLED3 and passes a light component of a red wavelength of white light. Boundaries between the neighboring color filters are located above the ribs 15.

The above-described array substrate AR and counter-substrate CT are attached by a sealant which attaches the array substrate AR and counter-substrate CT on an outside of a display section which displays an image. A transparent filler 40 is sealed between the array substrate AR and counter-substrate CT. Specifically, the organic EL elements OLED1 to OLED3 are located between the first resin substrate 10 and second resin substrate 30. In the example illustrated, the sealing film 20 and filler 40 are interposed between the organic EL element OLED1 and blue color filter 32B, between the organic EL element OLED2 and green color filter 32G and between the organic EL element OLED3 and red color filter 32R. It is desirable that the filler 40 be formed of a material having a moisture-absorbing capability. Thereby, even if a defect occurs in the sealing film 20, the filler 40 enters the defect of the sealing film 20, and can block a moisture entrance path.

Incidentally, the array substrate AR and counter-substrate CT may be attached by an adhesive having a moisture-absorbing capability, in place of the filler.

According to the above-described organic EL display device that is an example of the display device 1, when each of the organic EL elements OLED1 to OLED3 has emitted light, this radiated light (white light) is emitted to the outside via the blue color filter 32B, green color filter 32G or red color filter 32R. At this time, a light component of a blue wavelength of the white light, which has been radiated from the organic EL element OLED1, passes through the blue color filter 32B. In addition, a light component of a green wavelength of the white light, which has been radiated from the organic EL element OLED2, passes through the green color filter 32G. A light component of a red wavelength of the white light, which has been radiated from the organic EL element OLED3, passes through the red color filter 32R. Thereby, color display is realized.

Next, other structure examples of the display device 1 of the embodiment will be described.

Figure 1B:
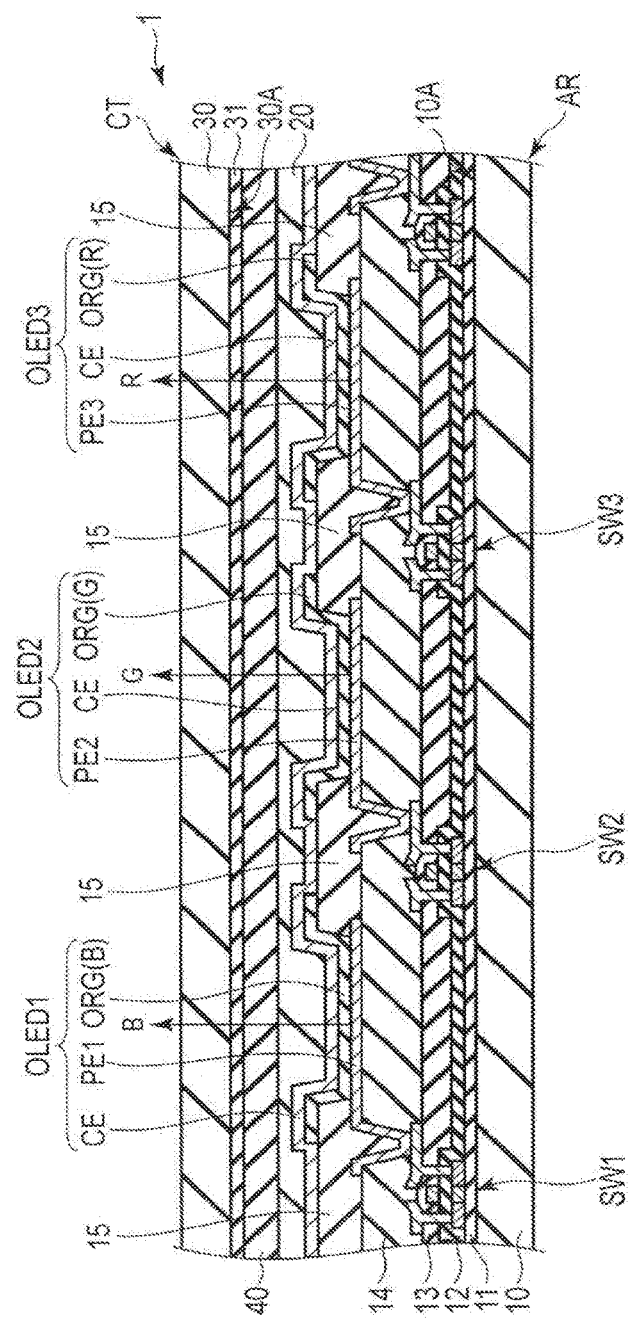
FIG. 1B is a cross-sectional view which schematically illustrates another structure example of the display device 1 of the embodiment.

FIG. 1B is a cross-sectional view which schematically illustrates another structure example of the display device 1 of the embodiment.

The illustrated structure example differs from the structure example shown in FIG. 1A in that the color filter of the counter-substrate CT is omitted, and the organic EL elements OLED1 to OLED3 emit lights of different colors. The same structure as in the structure example shown in FIG. 1A is denoted by like reference numerals, and a detailed description thereof is omitted.

Specifically, the array substrate AR includes a first resin substrate 10, a first insulation film 11, a second insulation film 12, a third insulation film 13, a fourth insulation film 14, ribs 15, switching elements SW1 to SW3, organic EL elements OLED1 to OLED3, and a sealing film 20. The thermal expansion coefficient of the first insulation film 11 is lower than the thermal expansion coefficient of the first resin substrate 10.

The organic EL element OLED1 is composed of a pixel electrode PE1 which is connected to the switching element SW1, an organic light emission layer ORG(B) which is located above the pixel electrode PE1, and a common electrode CE which is located above the organic light emission layer ORG(B). The organic EL element OLED2 is composed of a pixel electrode PE2 which is connected to the switching element SW2, an organic light emission layer ORG(G) which is located above the pixel electrode PE2, and the common electrode CE which is located above the organic light emission layer ORG(G). The organic EL element OLED3 is composed of a pixel electrode PE3 which is connected to the switching element SW3, an organic light emission layer ORG(R) which is located above the pixel electrode PE3, and the common electrode CE which is located above the organic light emission layer ORG(R).

The organic light emission layer ORG(B) emits blue light, the organic light emission layer ORG(G) emits green light, and the organic light emission layer ORG(R) emits red light. The organic light emission layer ORG(B), the organic light emission layer ORG(G) and the organic light emission layer ORG(R) are made discontinuous at locations above the ribs 15. The common electrode CE is continuously formed, without a break, over the organic EL elements OLED1 to OLED3, and also covers the ribs 15.

The counter-substrate CT includes a second resin substrate 30 and a fifth insulation film 31. The second resin substrate 30 is formed of, for example, a transparent polyimide, and the first resin substrate 10 is formed of, for example, an opaque polyimide with good heat resistance.

The thermal expansion coefficient of the first resin substrate 10 is substantially equal to the thermal expansion coefficient of the second resin substrate 30, and the thermal expansion coefficient of the first insulation film 11 is substantially equal to the thermal expansion coefficient of the fifth insulation film 31. In addition, the thermal expansion coefficients of the first insulation film 11 and fifth insulation film 31 are lower than the thermal expansion coefficients of the first resin substrate 10 and second resin substrate 30. For example, each of the thermal expansion coefficients of the first insulation film 11 and fifth insulation film 31 is 0.5 to 3 ppm/° C., and each of the thermal expansion coefficients of the first resin substrate 10 and second resin substrate 30 is 20 to 50 ppm/° C. As has been described above, the thermal expansion coefficients of the first resin substrate 10, second resin substrate 30, first insulation film 11 and fifth insulation film 31 are so set as to meet the above-described relationship, and thereby a warp of the display device 1 can be prevented.

The above-described array substrate AR and counter-substrate CT are attached.

Figure 1C:
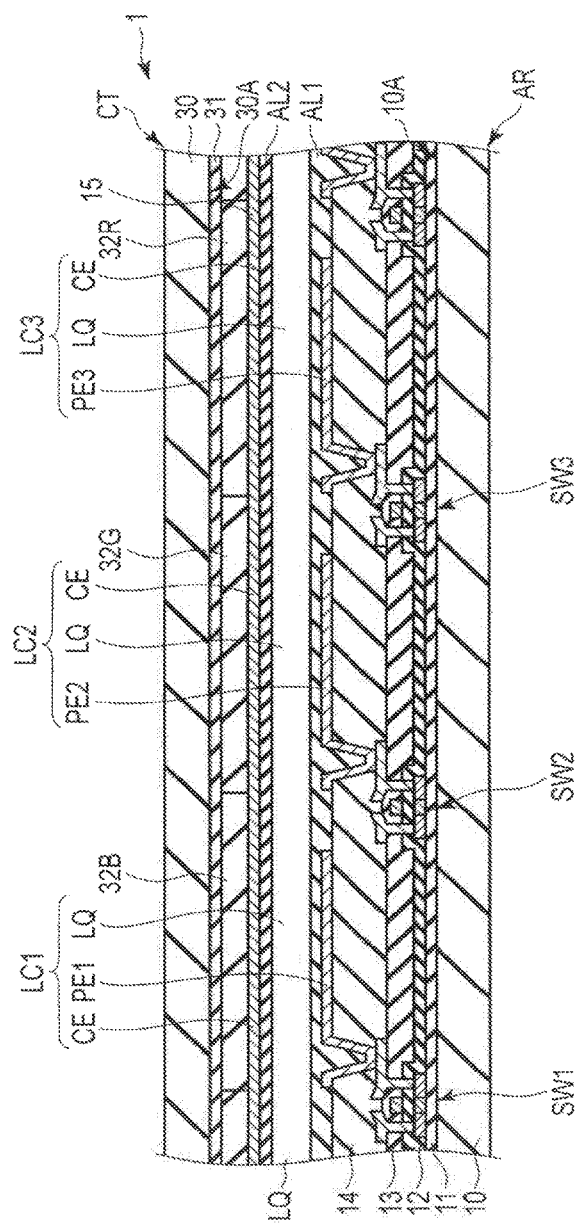
FIG. 1C is a cross-sectional view which schematically illustrates another structure example of the display device 1 of the embodiment.

FIG. 1C is a cross-sectional view which schematically illustrates another structure example of the display device 1 of the embodiment. A description is given of a cross-sectional structure of a liquid crystal display device as an example of the display device 1.

The illustrated structure example differs from the structure example shown in FIG. 1A in that this illustrated structure example includes liquid crystal elements as display elements. The same structure as in the structure example shown in FIG. 1A is denoted by like reference numerals, and a detailed description thereof is omitted.

Specifically, the array substrate AR includes a first resin substrate 10, a first insulation film 11, a second insulation film 12, a third insulation film 13, a fourth insulation film 14, switching elements SW1 to SW3, pixel electrodes PE1 to PE3, and a first alignment film AL1. The thermal expansion coefficient of the first insulation film 11 is lower than the thermal expansion coefficient of the first resin substrate 10.

The pixel electrode PE1 is connected to the switching element SW1, the pixel electrode PE2 is connected to the switching element SW2, and the pixel electrode PE3 is connected to the switching element SW3. The first alignment film AL1 covers the pixel electrodes PE1 to PE3.

The counter-substrate CT includes a second resin substrate 30, a fifth insulation film 31, a blue color filter 32B, a green color filter 32G, a red color filter 32R, a common electrode CE, and a second alignment film AL2. The second resin substrate 30 is formed of a material which is different from the material of the first resin substrate 10. For example, the second resin substrate 30 is formed of a transparent polyimide, and the first resin substrate 10 is formed of an opaque polyimide with good heat resistance.

The thermal expansion coefficient of the first resin substrate 10 is substantially equal to the thermal expansion coefficient of the third resin substrate 30, and the thermal expansion coefficient of the first insulation film 11 is substantially equal to the thermal expansion coefficient of the fifth insulation film 31. In addition, the thermal expansion coefficients of the first insulation film 11 and fifth insulation film 31 are lower than the thermal expansion coefficients of the first resin substrate 10 and second resin substrate 30. For example, each of the thermal expansion coefficients of the first insulation film 11 and fifth insulation film 31 is 0.5 to 3 ppm/° C., and each of the thermal expansion coefficients of the first resin substrate 10 and second resin substrate 30 is 20 to 50 ppm/° C. As has been described above, the thermal expansion coefficients of the first resin substrate 10, second resin substrate 30, first insulation film 11 and fifth insulation film 31 are so set as to meet the above-described relationship, and thereby a warp of the display device 1 can be prevented.

The blue color filter 32B is located above the pixel electrode PE1, the green color filter 32G is located above the pixel electrode PE2, and the red color filter 32R is located above the pixel electrode PE3. The common electrode CE is opposed to each of the pixel electrodes PE1 to PE3. The second alignment film AL2 covers the common electrode CE.

The array substrate AR and counter-substrate CT are attached by an adhesive (or sealant) in the state in which a predetermined cell gap is created by spacers (not shown). A liquid crystal layer LQ is held in the cell gap between the array substrate AR and counter-substrate CT. The liquid crystal layer LQ includes liquid crystal molecules, the alignment state of which is controlled by an electric field between the pixel electrodes PE and the common electrode CE.

A liquid crystal element LC1 is composed of the pixel electrode PE1, liquid crystal layer LQ and common electrode CE. A liquid crystal element LC2 is composed of the pixel electrode PE2, liquid crystal layer LQ and common electrode CE. A liquid crystal element LC3 is composed of the pixel electrode PE3, liquid crystal layer LQ and common electrode CE.

In the example illustrated, the case has been described that the pixel electrodes PE1 to PE3, which constitute the respective liquid crystal elements, are provided on the array substrate AR and the common electrode CE is provided on the counter-substrate CT. Alternatively, both the pixel electrodes PE1 to PE3 and the common electrode CE may be provided on the array substrate Ar.

According to the present embodiment, the display device 1 is configured such that the first resin substrate 10 and second resin substrate 30 are applied. Thus, compared to a display device to which glass substrates are applied, the reduction in thickness and weight can be realized, the flexibility is high, and the degree of freedom in shape is high. In addition, although the first resin substrate 10 and second resin substrate 30 have relatively high moisture absorption properties, the inner surface 10A of the first resin substrate 10 is covered with the first insulation film 11 that is the first barrier layer, and the inner surface 30A of the second resin substrate 30 is covered with the fifth insulation film 31 that is the second barrier layer. Thus, the entrance of moisture, etc. via the first resin substrate 10 or second resin substrate 30 can be suppressed. Thereby, it is possible to suppress degradation due to moisture, etc. of the display elements located between the first resin substrate 10 and second resin substrate 30.

In addition, the first resin substrate 10, which constitutes the array substrate AR, is formed of, for example, an opaque polyimide with good heat resistance, and the second resin substrate 30, which constitutes the counter-substrate CT, is formed of, for example, a transparent polyimide, which is different from the material of the first resin substrate 10. Moreover, the thermal expansion coefficient of the first resin substrate 10 is equal to the thermal expansion coefficient of the second resin substrate 30. Thus, even if the display device 1 is thermally expanded, there is little difference in thermal expansion coefficient between the first resin substrate 10 and the second resin substrate 30. Therefore, the occurrence of a warp of the display device 1 can be suppressed.

Furthermore, the first insulation film (first barrier layer) 11, which covers the inner surface 10A of the first resin substrate 10, has a lower thermal expansion coefficient than the first resin substrate 10. In addition, the fifth insulation film (second barrier layer) 31, which covers the inner surface 30A of the second resin substrate 30, has a lower thermal expansion coefficient than the second resin substrate 30. The difference in thermal expansion coefficient between the first resin substrate 10 and first insulation film 11 is equal to the difference in thermal expansion coefficient between the second resin substrate 30 and fifth resin substrate 31. Thus, although stresses occur in both the array substrate AR and counter-substrate CT, these stresses are balanced and therefore the occurrence of a warp of the display device 1 can be suppressed. Hence, the shape of the display device 1 can stably be maintained.

Besides, since the thickness of the first resin substrate 10 is equal to the thickness of the second resin substrate 30, the variation in dimension due to thermal expansion is equal between the first resin substrate 10 and second resin substrate 30, and the shape of the display device 1 can further be stabilized.

Figure 2:
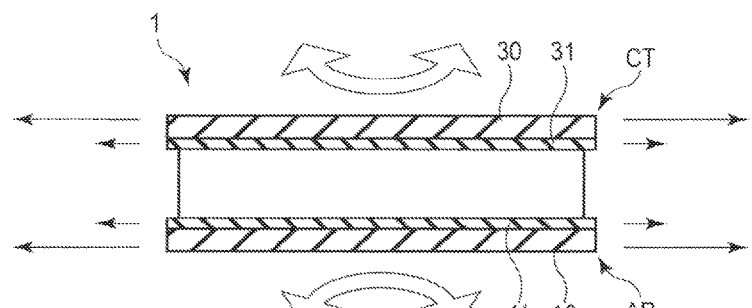
FIG. 2 schematically illustrates a state in which a stress occurs in each of an array substrate AR and a counter-substrate CT in the display device 1 of the embodiment.

In FIG. 2, arrows schematically illustrate a relationship between the thermal expansion coefficients of the first resin substrate 10, first insulation film 11, second resin substrate 30 and fifth insulation film 31 in the array substrate AR and counter-substrate CT in the display device 1 of the embodiment.

In the manufacturing process of the display device 1 of the embodiment, the first resin substrate 10, first insulation film 11, second resin substrate 30 and fifth insulation film 31 are formed in a state of relatively high temperatures. At this time, since the thermal expansion coefficients of the first resin substrate 10 and second resin substrate 30 are higher than the thermal expansion coefficients of the first insulation film 11 and fifth insulation film 31, the first resin substrate 10 and second resin substrate 30 are, at a time immediately after the display device 1 has been formed at high temperatures, are formed with a predetermined size in the state in which the first resin substrate 10 and second resin substrate 30 are expanded to a greater degree than the first insulation film 11 and fifth insulation film 31. The ratio of contraction of the first resin substrate 10 and second resin substrate 30 at a time when the display device 1 has been cooled from the high-temperature state is greater than the ratio of contraction of the first insulation film 11 and fifth insulation film 31. Accordingly, as the display device 1 which was formed at high temperatures is cooled, a stress occurs in the peripheral part of the array substrate AR such that the peripheral part of the array substrate AR warps toward the outside of the first resin substrate 10 (i.e. to a side away from the counter-substrate CT). On the other hand, a stress similarly occurs in the counter-substrate CT such that the peripheral part of the counter-substrate CT warps toward the outside of the second resin substrate 30 (i.e. to a side away from the array substrate AR). In addition, the thermal expansion coefficients of the first resin substrate 10 and second resin substrate 30 are equal, and the thermal expansion coefficients of the first insulation film 11 and fifth insulation film 31 are equal. Thus, such a stress as to cause an outward warp on the array substrate AR side is substantially equal to such a stress as to cause an outward warp on the counter-substrate CT side.

As has been described above, although stresses occur in both the array substrate AR and counter-substrate CT, these stresses substantially equally act in such direction as to make the array substrate AR and counter-substrate CT closer to each other, and therefore the shape of the display device 1 can be maintained. In addition, when the temperature of the environment of use of the display device 1 is low, since such stresses as to cause outward warps equally occur in both the array substrate AR and counter-substrate CT, the shape of the display device 1 can be maintained. Even when the temperature of the environment of use of the display device 1 is high, stresses have been acting to cause outward warps since before. Thus, the shape of the display device 1 can be maintained as long as the temperature of use exceeds the temperature in the manufacturing process. As regards the organic EL display device as shown in FIG. 1A and FIG. 1B, even when the adhesion force of the adhesive for attaching the array substrate AR and counter-substrate CT is weak, the shape of the display device 1 can be maintained since the stresses occurring in both the array substrate AR and counter-substrate CT act in such directions as to make the array substrate AR and counter-substrate CT closer to each other. As regards the liquid crystal display device as shown in FIG. 1C, the shape of the display device 1 can be maintained and the cell gap can be kept since the stresses occurring in both the array substrate AR and counter-substrate CT act in such directions as to press the spacers lying between the array substrate AR and counter-substrate CT, and therefore degradation in display quality can be suppressed.

In the meantime, a comparative example will now be examined, in which the thermal expansion coefficient of the first resin substrate 10 is lower than the thermal expansion coefficient of the first insulation film 11, and the thermal expansion coefficient of the second resin substrate 30 is lower than the thermal expansion coefficient of the fifth insulation film 31. In this comparative example, in the array substrate AR after fabrication, such a stress occurs that the central part of the array substrate AR warps toward the outside of the first resin substrate 10. On the other hand, in the counter-substrate CT after fabrication, such a stress occurs that the central part of the counter-substrate CT warps toward the outside of the second resin substrate 30. In this manner, the stresses occurring in both the array substrate AR and counter-substrate CT act in such directions as to make the array substrate AR and counter-substrate CT away from each other at the central part of the display device 1.

Thus, as regards the organic EL display device as shown in FIG. 1A and FIG. 1B, when the adhesion force between the array substrate AR and counter-substrate CT is weak, the shape of the display device 1 can hardly be maintained. As regards the liquid crystal display device as shown in FIG. 1C, there is a concern that the degradation in display quality or the occurrence of bubbles will occur, since the stresses occurring in both the array substrate AR and counter-substrate CT act in such directions as to increase the cell gap between the array substrate AR and counter-substrate CT.

As has been described above, according to the display device 1 of the present embodiment, the shape can be maintained more stably than in the comparative example, and the degradation in display quality can be suppressed.

Next, a description is given of an example of a method of manufacturing the display device 1 according to the embodiment. In the description below, an example of the manufacturing method of the display device with the structure example shown in FIG. 1A will be described.

Figure 3:
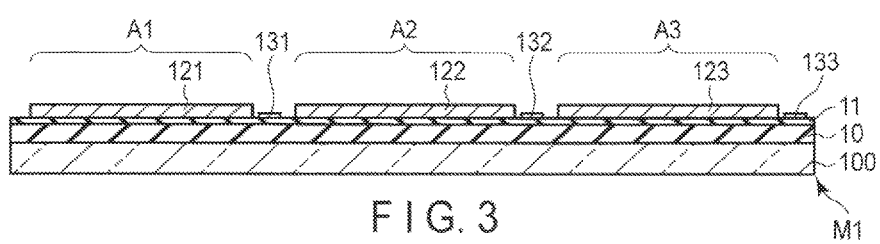
FIG. 3 is a view for describing a manufacturing method of the display device 1 of the embodiment, illustrating a step of preparing a first mother substrate M1.

To begin with, as illustrated in FIG. 3, a first mother substrate M1 is prepared. Specifically, a film of a resin material with a desired thickness is formed on a first support substrate 100 such as a glass substrate. Then, this film is cured, and a first resin substrate 10 is formed. At this time, the first resin substrate 10 extends over a region corresponding to the display section, this region being a part of the region which becomes an individual array substrate after a cutting step (to be described later). In the example illustrated, the first resin substrate 10 extends over regions corresponding to three display sections, namely a first region A1, a second region A2 and a third region A3. Thereafter, on the first resin substrate 10, a thin film of an inorganic material is formed and, where necessary, a multilayer of thin films is formed. Thereby, a first insulation film 11 is formed. The first insulation film 11 extends over the first region A1, second region A2 and third region A3.

Subsequently, a display element part 121 is formed in the first region A1 on the first insulation film 11, a display element part 122 is formed in the second region A2 on the first insulation film 11, and a display element part 123 is formed in the third region A3 on the first insulation film 11. In addition, mounting portions 131 to 133 for mounting signal supply sources, such as driving IC chips and flexible circuit boards, are formed on the first insulation film 11. The display element parts 121 to 123 have the same structure, and each of the display element parts 121 to 123 includes a plurality of display elements, for example, organic EL elements, which are arranged in a matrix.

The display element parts 121 to 123 are formed in the following manner. Specifically, switching elements SW1 to SW3, a second insulation film 12, a third insulation film 13 and a fourth insulation film 14 are formed on the first insulation film 11. At the same time, various wirings are formed. Subsequently, pixel electrodes PE1 to PE3 are formed on the fourth insulation film 14, and then ribs 15 are formed. Thereafter, an organic light emission layer ORG is formed, and a common electrode CE is formed. Through these steps, organic EL elements OLED1 to OLED3 are formed. Then, where necessary, a sealing film 20, which covers the organic EL elements OLED1 to OLED3, is formed.

Figure 4:
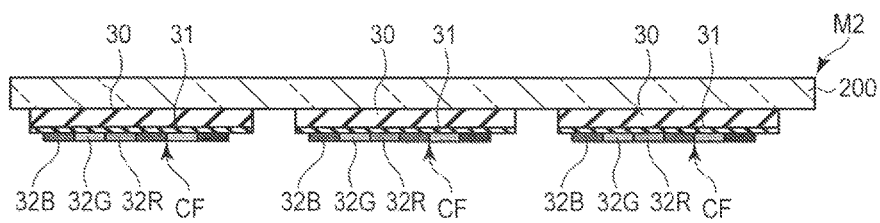
FIG. 4 is a view for describing the manufacturing method of the display device 1 of the embodiment, illustrating a step of preparing a second mother substrate M2.

Subsequently, as illustrated in FIG. 4, a second mother substrate M2 is prepared. Specifically, a film of a resin material with a desired thickness is formed on a second support substrate 200 such as a glass substrate. Thereafter, the film of resin material is cured and then patterned by using a photolithography process or the like. Thereby, transparent second resin substrates 30 are formed. The individual second resin substrates 30 are spaced apart from each other. Specifically, each of the second resin substrates 30 is formed in an island shape on the second support substrate 200.

A thin film of an inorganic material is formed on each of the second resin substrates 30 and, where necessary, a multilayer of thin films is formed. Thus, fifth insulation films 31 are formed.

A color filter layer CF is formed on each of the fifth insulation films 31. The color filter layers CF have the same structure, and each color filter layer includes a blue color filter 32B, a green color filter 32G and a red color filter 32R.

Figure 5:
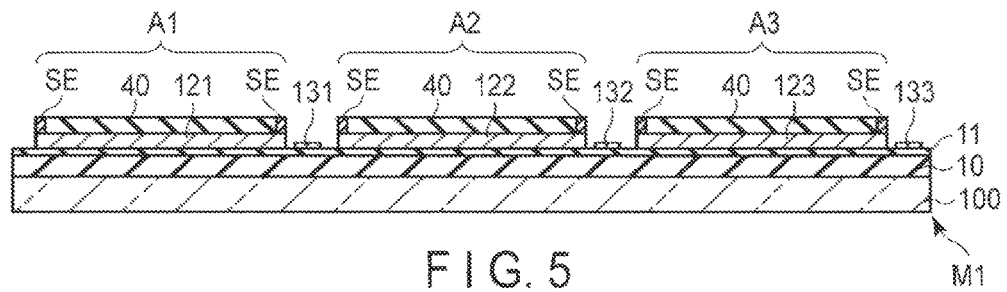
FIG. 5 is a view for describing a step of coating a sealant SE and an adhesive 40.

Subsequently, as illustrated in FIG. 5, a frame-shaped sealant SE is formed in each of the first region A1, second region A2 and third region A3, and then a filler (or an adhesive) 40 is coated in an inside surrounded by the sealant SE.

Figure 6:
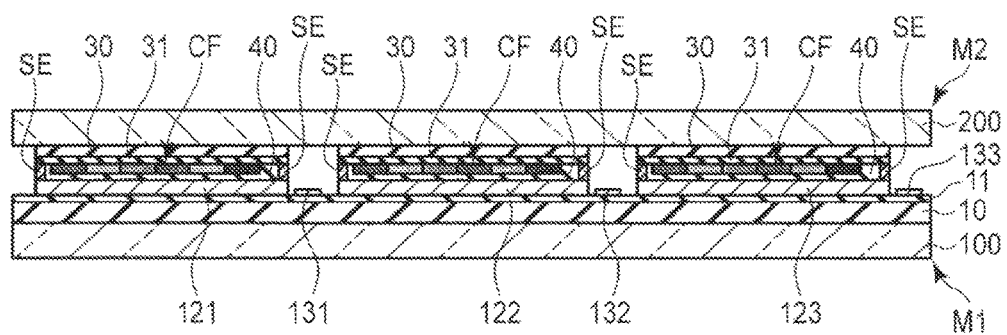
FIG. 6 is a view for describing the manufacturing method of the display device 1 of the embodiment, illustrating a step of attaching the first mother substrate M1 and the second mother substrate M2.

Thereafter, as illustrated in FIG. 6, the first mother substrate M1 and second mother substrate M2 are attached. Specifically, the respective display element parts 121 to 123 are attached to the color filter layers CF by the sealant SE and adhesive 40.

Figure 7:
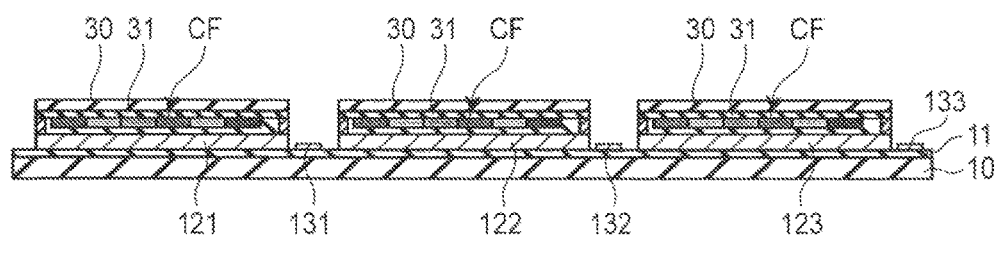
FIG. 7 is a view for describing the manufacturing method of the display device 1 of the embodiment, illustrating a step of peeling a first support substrate 100 of the first mother substrate M1 and a second support substrate 200 of the second mother substrate M2.

Subsequently, as illustrated in FIG. 7, with respect to the second mother substrate M2, the second support substrate 200 is peeled from the second resin substrate 30, and the second support substrate 200 is removed. Similarly, with respect to the first mother substrate M1, the first support substrate 100 is peeled from the first resin substrate 10, and the first support substrate 100 is removed. As regards the peeling and removal of the first support substrate 100 and second support substrate 200, for example, a technology called "laser ablation" is applicable. The laser ablation is a technique in which a laser beam is radiated on the support substrate, whereby local energy absorption occurs at the interface between the support substrate and the resin substrate and the support substrate is made separable from the resin substrate. An excimer laser, for example, is applicable as the light source for emitting the laser beam.

Figure 8:
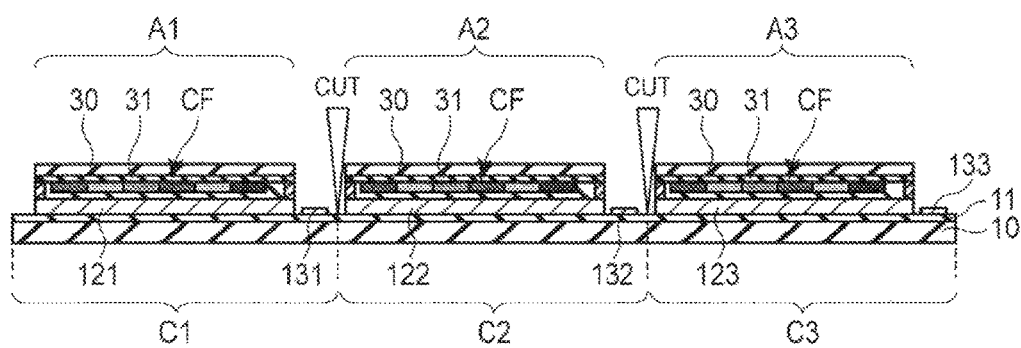
FIG. 8 is a view for describing the manufacturing method of the display device 1 of the embodiment, illustrating a step of cutting a first resin substrate 10.

Subsequently, as illustrated in FIG. 8, the first resin substrate 10 is cut. In the example illustrated, the first resin substrate 10 is cut between the first region A1 and second region A2 and between the second region A2 and third region A3. Thereby, chips C1 to C3 are separated. The chip C1 includes the display element part 121 in the first region A1, and includes the mounting portion 131 on the outside of the first region A1. The chip C2 includes the display element part 122 in the second region A2, and includes the mounting portion 132 on the outside of the second region A2. The chip C3 includes the display element part 123 in the third region A3, and includes the mounting portion 133 on the outside of the third region A3.

Subsequently, a signal supply source is mounted on each of the mounting portions 131 to 133.

Thereby, the display device (organic EL display device) 1 of the present embodiment is manufactured.

During the above-described manufacturing process, the display device (organic EL display device) 1 of the present embodiment is exposed in a high-temperature state. However, as described above, the thermal expansion coefficients of the first resin substrate 10, second resin substrate 30, fifth insulation film 31 and first insulation film 11 are so set as to meet the above-described relationship. Thereby, a warp of the display device 1 can be prevented.

As has been described above, according to the present embodiment, a display device, which can stably maintain the shape thereof, can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a display device, comprising:
    forming a first resin substrate which is obtained by
        forming a film of a first resin material on a first support substrate, the first resin material being opaque and having a first thermal expansion coefficient;

forming a first barrier layer on the first resin substrate, the first barrier layer having a second thermal expansion coefficient which is lower than the first thermal expansion coefficient;

forming a display portion on the first barrier layer, the display portion including an organic electroluminescence element and a sealing film covering the organic electroluminescence element;

forming a mounting portion on the first barrier layer;

forming a second resin substrate which is obtained by forming a film of a second resin material, the second resin material being transparent;

attaching the display portion and the second resin substrate to each other with an adhesive; and peeling the first support substrate from the first resin substrate, on which the mounting portion is formed, by radiating a laser beam on the first support substrate.

2. The manufacturing method of the display device of claim 1, wherein the first thermal expansion coefficient is 20 to 50 ppm/° C.

3. The manufacturing method of the display device of claim 1, wherein the second thermal expansion coefficient is 0.5 to 3.0 ppm/° C.

4. The manufacturing method of the display device of claim 1, wherein the first resin substrate is formed of the first resin material including polyimide as a main component.

5. The manufacturing method of the display device of claim 1, wherein the first barrier layer is formed of an inorganic material including silicon as a main component.

6. The manufacturing method of the display device of claim 1, wherein the first barrier layer is formed of a multilayer body in which silicon nitride and silicon oxide are alternately stacked.

7. The manufacturing method of the display device of claim 1, wherein at a time immediately after the display device is formed at a high temperature, the first resin substrate is expanded to a greater degree than the first barrier layer.

8. The manufacturing method of the display device of claim 7, wherein at a time when the display device is cooled from a high-temperature state, a ratio of contraction of the first resin substrate is greater than a ratio of contraction of the first barrier layer.

9. The manufacturing method of the display device of claim 8, wherein at the time when the display device is cooled, a first stress which warps a first peripheral part of the first resin substrate to a side away from the second resin substrate occurs, a second stress which warps a second peripheral part of the second resin substrate to a side away from the first resin substrate occurs, and the first stress is substantially equal to the second stress.

* * * * *